United States Patent
You et al.

(10) Patent No.: US 8,586,984 B2
(45) Date of Patent: Nov. 19, 2013

(54) ORGANIC LIGHT-EMITTING DISPLAY DEVICE AND METHOD OF MANUFACTURING THE SAME

(75) Inventors: Chun-Gi You, Yongin (KR); Joon-Hoo Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 352 days.

(21) Appl. No.: 13/080,405

(22) Filed: Apr. 5, 2011

(65) Prior Publication Data

US 2011/0309339 A1  Dec. 22, 2011

(30) Foreign Application Priority Data

Jun. 17, 2010 (KR) ........................ 10-2010-0057566

(51) Int. Cl.
  *H01L 29/04* (2006.01)
  *H01L 29/10* (2006.01)
  *H01L 31/00* (2006.01)

(52) U.S. Cl.
  USPC .......... 257/57; 257/59; 257/40; 257/E51.018; 438/82; 438/149

(58) Field of Classification Search
  USPC .......... 257/40, 57, 59, E51.018; 438/82, 149
  See application file for complete search history.

(56) References Cited

U.S. PATENT DOCUMENTS

| 7,416,917 | B2 | 8/2008 | Ko |
| 7,480,015 | B2 | 1/2009 | Kim et al. |
| 2005/0195874 | A1 | 9/2005 | Forrest et al. |
| 2007/0286944 | A1 | 12/2007 | Yokoyama et al. |
| 2010/0049017 | A1 | 2/2010 | LeBouf et al. |
| 2010/0193790 | A1* | 8/2010 | Yeo et al. ........................ 257/59 |
| 2011/0114956 | A1 | 5/2011 | Park et al. |
| 2012/0091459 | A1* | 4/2012 | Choi et al. ...................... 257/59 |

FOREIGN PATENT DOCUMENTS

| KR | 1020050070908 A | 7/2005 |
| KR | 1020060001746 A | 1/2006 |
| KR | 1020070050612 A | 5/2007 |
| KR | 1020070065551 A | 6/2007 |

(Continued)

OTHER PUBLICATIONS

Korean Registration Determination Certificate issued on Jan. 29, 2013 in the corresponding Korean Patent Application No. 10-2010-0057566.

*Primary Examiner* — Phat X Cao
(74) *Attorney, Agent, or Firm* — Robert E. Bushnell, Esq.

(57) ABSTRACT

An organic light-emitting display device includes an active layer of a thin film transistor arranged on a substrate, a first insulating layer and a gate electrode arranged on the active layer, the gate electrode including a first transparent conductive layer and a first metal layer, a second insulating layer arranged on the gate electrode and including a plurality of contact holes that expose a source region and a drain region of the active layer, a reflective layer and a second transparent conductive layer arranged within the contact holes, a source electrode and a drain electrode arranged on the second transparent conductive layer and on the second insulating layer, the source electrode and the drain electrode each including a second metal layer, a pixel electrode arranged on the first insulating layer, the pixel electrode including the first transparent conductive layer, the reflective layer, and the second transparent conductive layer, an intermediate layer arranged on the pixel electrode and including an organic emission layer and an opposite electrode facing the pixel electrode, wherein the intermediate layer is arranged between the pixel electrode and the opposite electrode.

25 Claims, 7 Drawing Sheets

(56) References Cited

FOREIGN PATENT DOCUMENTS

| KR | 1020070068092 A | 6/2007 |
| KR | 10-0943187 B1 | 2/2010 |
| KR | 1020110052950 A | 5/2011 |

\* cited by examiner

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT EMITTING DISPLAY DEVICE AND METHOD OF MANUFACTURING THE SAME earlier filed in the Korean Intellectual Property Office on 17 Jun. 2010 and there duly assigned Serial No. 10-2010-0057566.

BACKGROUND OF THE INVENTION

1. Field of the Invention

The present invention relates to an organic light-emitting display device fabricated in a simple way and having excellent display characteristics and a method of manufacturing the organic light-emitting display device.

2. Description of the Related Art

Organic light-emitting display devices are self-emissive display devices in which a voltage is applied to a thin film layer including a cathode, an anode, and an organic emission layer disposed between the two electrodes in order to emit light by recombining electrons and holes in the organic emission layer. Organic light-emitting display devices have been considered as next generation display apparatuses due to their advantages such as light weight, thin thickness, wide viewing angle, fast response speeds, and low power consumption.

On the other hand, organic light-emitting display devices for realizing full-color images adopt an optical resonance structure for changing optical lengths of wavelengths that are emitted from organic emission layers in pixels of different colors (for example, red, green, and blue pixels).

SUMMARY OF THE INVENTION

The present invention provides an organic light-emitting display device that can be fabricated in a simple way and has excellent display characteristics, and a method of manufacturing the organic light-emitting display device.

According to one aspect of the present invention, there is provided an organic light-emitting display device including an active layer of a thin film transistor arranged on a substrate, a first insulating layer and a gate electrode arranged on the active layer, the gate electrode including a first transparent conductive layer and a first metal layer, a second insulating layer arranged on the gate electrode and including a plurality of contact holes that expose a source region and a drain region of the active layer, a reflective layer and a second transparent conductive layer arranged within the contact holes, a source electrode and a drain electrode arranged on the second transparent conductive layer and on the second insulating layer, the source electrode and the drain electrode each including a second metal layer, a pixel electrode arranged on the first insulating layer, the pixel electrode including the first transparent conductive layer, the reflective layer, and the second transparent conductive layer, an intermediate layer arranged on the pixel electrode and including an organic emission layer and an opposite electrode facing the pixel electrode, wherein the intermediate layer is arranged between the pixel electrode and the opposite electrode.

The reflective layer may include silver (Ag). The first transparent conductive layer and the second transparent conductive layer each may include at least one material selected from a group consisting of indium tin oxide (ITO), indium zinc oxide (IZO), zinc oxide (ZnO), indium oxide ($In_2O_3$), indium gallium oxide (IGO), and aluminum zinc oxide (AZO). The first metal layer and the second metal layer may each include a plurality of metal layers. The first metal layer and the second metal layer may each include a same material. The first metal layer and the second metal layer may each include aluminum (Al). An end portion of the first transparent conductive layer of the pixel electrode, and end portions of the reflective layer and the second transparent conductive layer may have different etch surfaces from each other. The first metal layer may be arranged on an upper portion of the first transparent conductive layer of the pixel electrode, on a side surface of the reflective layer, and on a lower portion of the second insulating layer. The first metal layer may be connected to one of the source electrode and the drain electrode via a via-hole that is arranged in the second insulating layer. The reflective layer and the second transparent conductive layer may be arranged within the via-hole.

The organic light-emitting display device may also include a capacitor that includes a first electrode that includes a same material as that of the active layer and is arranged on a same layer as the active layer and a second electrode including the first transparent conductive layer, the first insulating layer being arranged between the first electrode and the second electrode. The second electrode of the capacitor may also include the reflective layer and the second transparent conductive layer on the first transparent conductive layer. The pixel electrode may be a transflective mirror that partially transmits and partially reflects light emitted from the organic emission layer. The opposite electrode may be a reflecting mirror that reflects light emitted from the organic emission layer. The organic light-emitting display device may also include a pixel defining layer surrounding edges of the pixel electrode and covering the source and drain electrodes.

According to another aspect of the present invention, there is provided a method of manufacturing an organic light-emitting display device, including forming a semiconductor layer on a substrate, forming an active layer of a thin film transistor by patterning the semiconductor layer, forming a first insulating layer, a first transparent conductive layer, and a first metal layer on the active layer, forming a base layer of a pixel electrode and a gate electrode of the thin film transistor by patterning the first transparent conductive layer and the first metal layer, forming a second insulating layer and an organic layer on the base layer of the pixel electrode and on the gate electrode, forming a first opening exposing the first transparent conductive layer of the pixel electrode while forming contact holes exposing source and drain regions of the active layer of the thin film transistor by patterning the second insulating layer and the organic layer, forming a reflective layer and a second transparent conductive layer in the first opening, in the contact holes, and on the organic layer that remains on the second insulating layer after the first opening and the contact holes are formed, removing the organic layer, forming a second metal layer in the first opening and in the contact holes and forming a source electrode and a drain electrode by patterning the second metal layer.

The method may also include forming the source and drain regions in the active layer after the forming of the gate electrode by doping the active layer with ion impurities while using the gate electrode as a mask. The forming of the first opening and the contact holes may include forming the first opening and the contact holes in the second insulating layer by a first etching process and removing the first metal layer on the base layer of the pixel electrode exposed by the first opening by a second etching process. The method may also include forming a via-hole in the first metal layer and in the second insulating layer on the base layer when the first opening and the contact holes are formed. The reflective layer and the second transparent conductive layer may be arranged within the via-hole. The source and drain electrodes may be simultaneously formed and may be arranged within the contact holes and within the via-hole. The method may also include exposing upper layers of the pixel electrode and forming a third insulating layer covering the source and drain electrodes after forming the source and drain electrodes. The third insulating layer may be produced by a mask process. A first electrode of a capacitor may be comprised of a same material as the active layer and is arranged on a same layer as the active layer and may be formed when the active layer is formed, and a second electrode of the capacitor may be comprised of the first transparent conductive layer and may be formed when the gate electrode is formed. The reflective layer, the second transparent conductive layer, and the second metal layer may be further arranged on the first transparent conductive layer of the capacitor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described with reference to accompanying drawings as follows.

Figure 15:
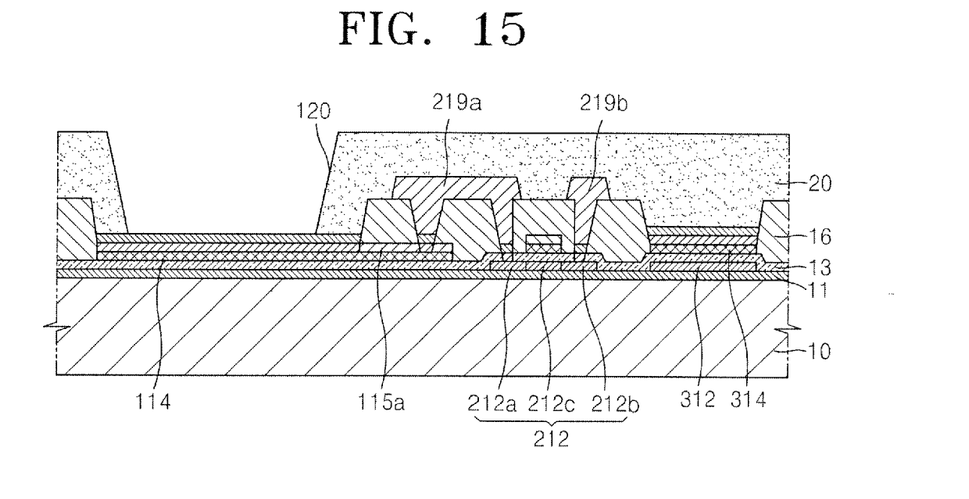
Figure 16:
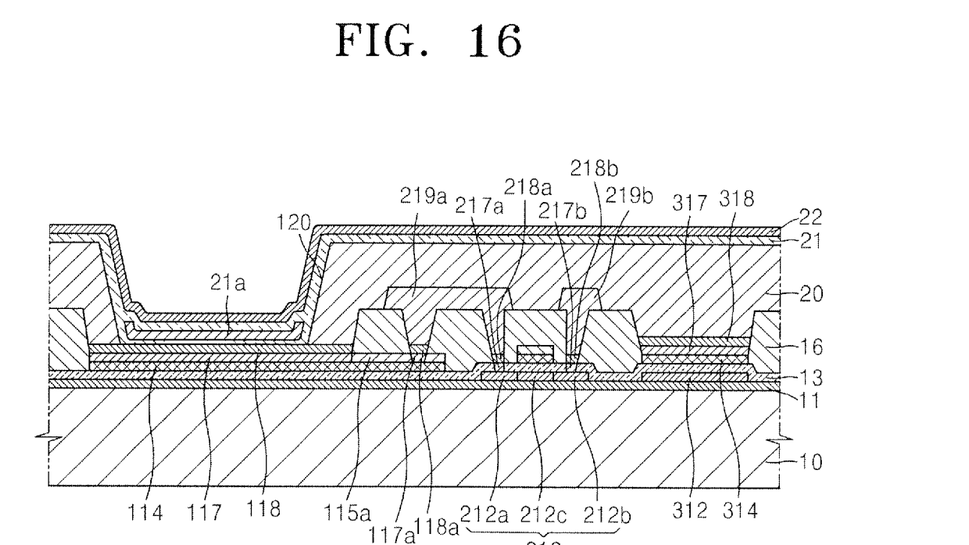
FIG. 16 is a schematic cross-sectional view of the organic light-emitting display device manufactured via the method illustrated in FIGS. 1 through 15.

An organic light-emitting display device and a method of manufacturing the organic light-emitting display device will be described with reference to FIGS. 1 through 16. FIGS. 1 through 15 are schematic cross-sectional views illustrating a method of manufacturing an organic light-emitting display device, according to an embodiment of the present invention, and FIG. 16 is a schematic cross-sectional view of the organic light-emitting display device manufactured according to the method illustrated in FIGS. 1 through 15.

Figure 1:
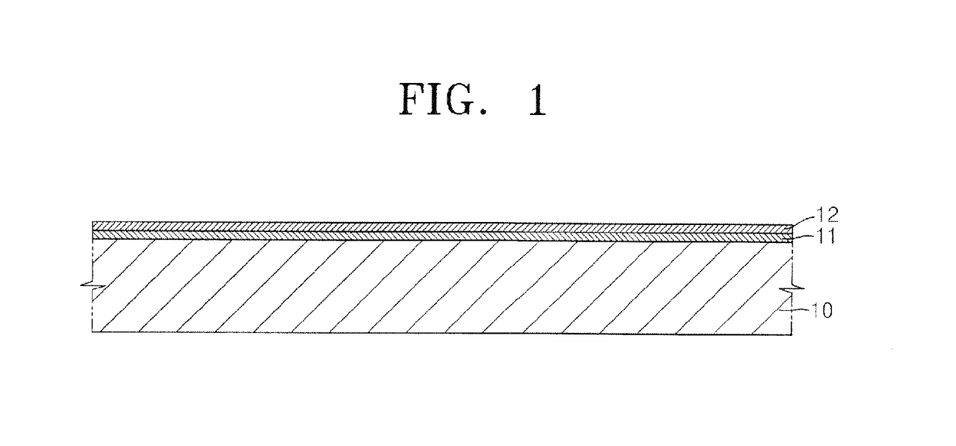
FIGS. 1 through 15 are schematic cross-sectional views illustrating a method of manufacturing an organic light-emitting display device, according to an embodiment of the present invention.

Referring to FIG. 1, a buffer layer 11 and a semiconductor layer 12 are sequentially formed in the stated order on a substrate 10. The substrate 10 may be made out of a transparent glass material mainly including $SiO_2$. The buffer layer 11, including $SiO_2$ and/or $SiN_x$, may be further formed on the substrate 10 in order to maintain smoothness of the substrate 10 and prevent impurities from infiltrating into the substrate 10.

The buffer layer 11 and the semiconductor layer 12 may be formed by a deposition technique, for example, a plasma enhanced chemical vapor deposition (PECVD) technique, an atmospheric pressure CVD (APCVD) technique, or a low pressure CVD (LPCVD) technique.

The semiconductor layer 12 is formed on the buffer layer 11. The semiconductor layer 12 may be made out of amorphous silicon or polycrystalline silicon. Here, the polycrystalline silicon may be obtained by crystallizing the amorphous silicon. The amorphous silicon may be crystallized by using a rapid thermal annealing (RTA) technique, a solid phase crystallization (SPC) technique, an excimer laser annealing (ELA) technique, a metal induced crystallization (MIC) technique, a metal induced lateral crystallization (MILC) technique, or a sequential lateral solidification (SLS) technique.

Figure 2:
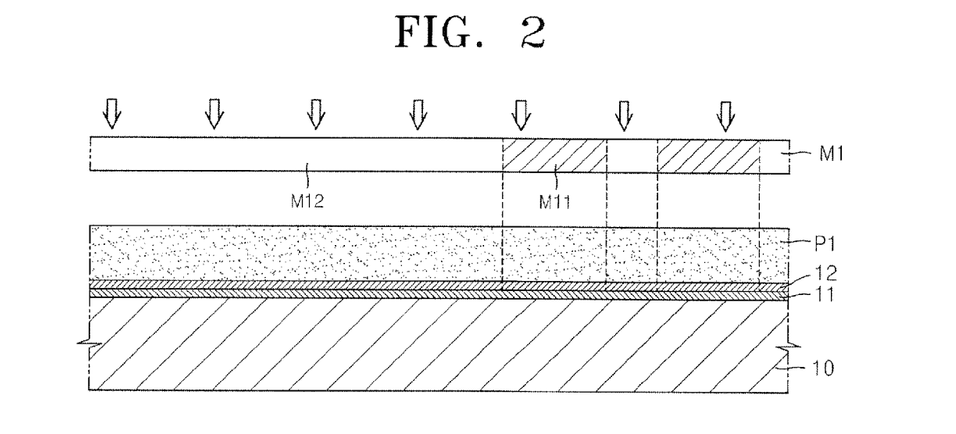

Referring now to FIG. 2, a first photoresist P1 layer is applied on the semiconductor layer 12, and then, a first mask process using a first photomask M1, which includes light-shielding portions M11 and light-transmitting portions M12, is performed. Although not shown in the drawings, the stack structure is exposed via the first photomask M1 by using an exposure device (not shown), and then, a series of processes, such as developing, etching, and stripping or ashing processes, are performed.

Figure 3:
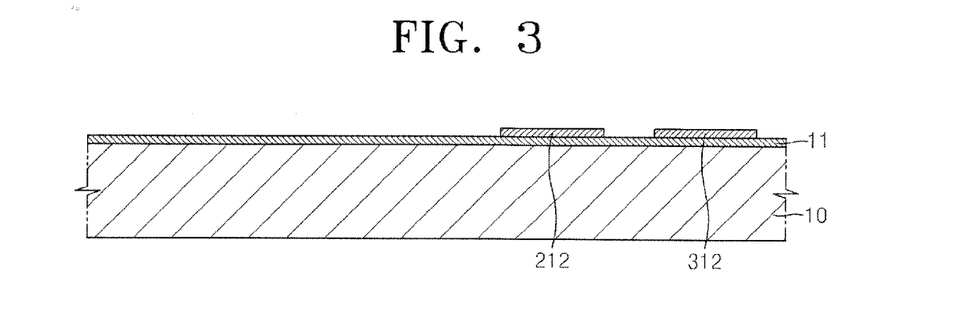

Referring now to FIG. 3, the semiconductor layer 12 is patterned into an active layer 212 of a thin film transistor and a first electrode 312 of a capacitor as a result of the first photomask process. The first electrode 312 is made out of the same material as the active layer 212 and is arranged on the same layer as the active layer 212.

Figure 4:
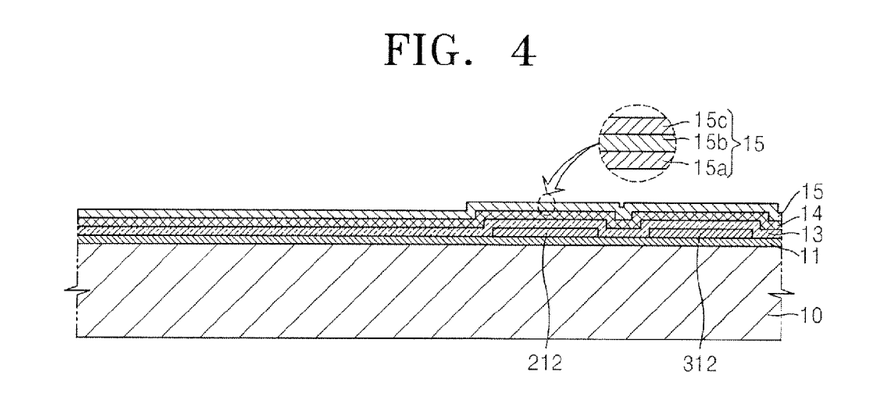

Referring now to FIG. 4, a first insulating layer 13, a first transparent conductive layer 14, and a first metal layer 15 are sequentially stacked in the stated order on the structure shown in FIG. 3. The first insulating layer 13 may have a single-layered structure or a multi-layered structure including $SiO_2$ or $SiN_x$, and serves as a gate insulating layer for the thin film transistor and as a dielectric layer for the capacitor. The first transparent conductive layer 14 may include at least one or more selected from a group consisting of indium tin oxide (ITO), indium zinc oxide (IZO), zinc oxide (ZnO), indium oxide ($In_2O_3$), indium gallium oxide (IGO), and aluminum zinc oxide (AZO). The first metal layer 15 may include at least one or more selected from a group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

In the current embodiment, the first metal layer 15 includes Al. Alternately, the first metal layer 15 may include a plurality of metal layers 15a, 15b, and 15c, and in the current embodiment, a three-layer structure (Mo/Al/Mo), that is, the metal layer 15b is made out of Al and the upper and lower metal layers 15c and 15a respectively are each made out of Mo, however, the present invention is in no way so limited to the above example as the first metal layer 15 may instead include other various materials and other various layers.

Figure 5:
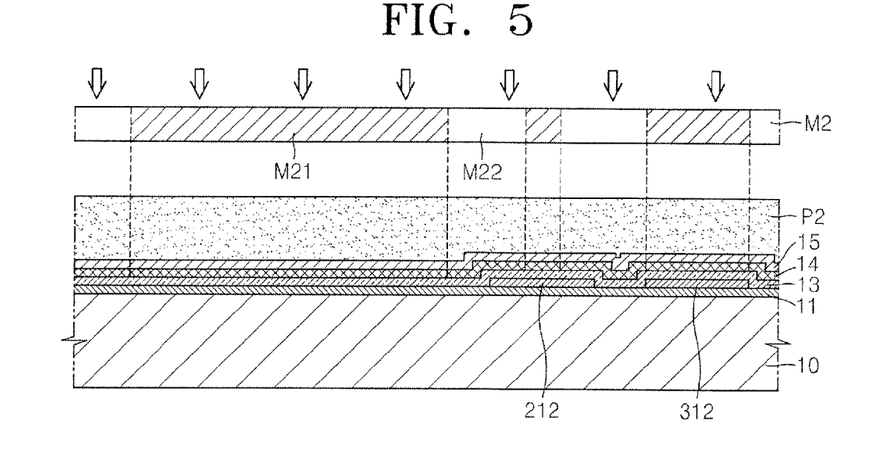

Referring now to FIG. 5, a second photoresist P2 layer is applied on the first metal layer 15, and a second mask process is performed using a second photomask M2, which includes light-shielding portions M21 and light-transmitting portions M22.

Figure 6:
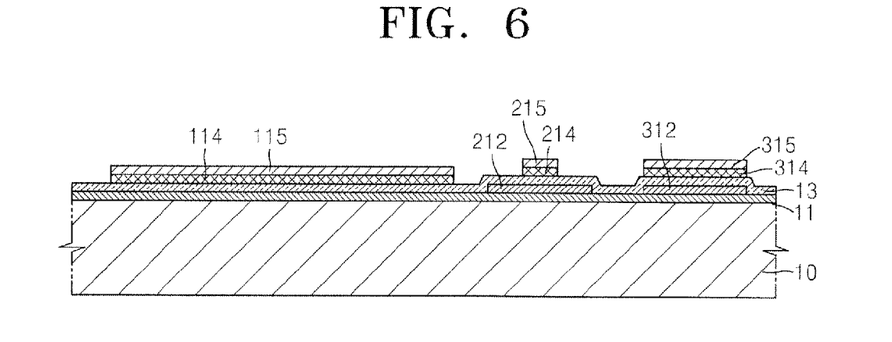

Referring now to FIG. 6, as a result of the second photomask process, the first transparent conductive layer 14 and the first metal layer 15 are respectively patterned to produce base layers 114 and 115 of a pixel electrode, gate electrodes 214 and 215 of the thin film transistor, and second electrodes 314 and 315 of the capacitor.

Figure 7:
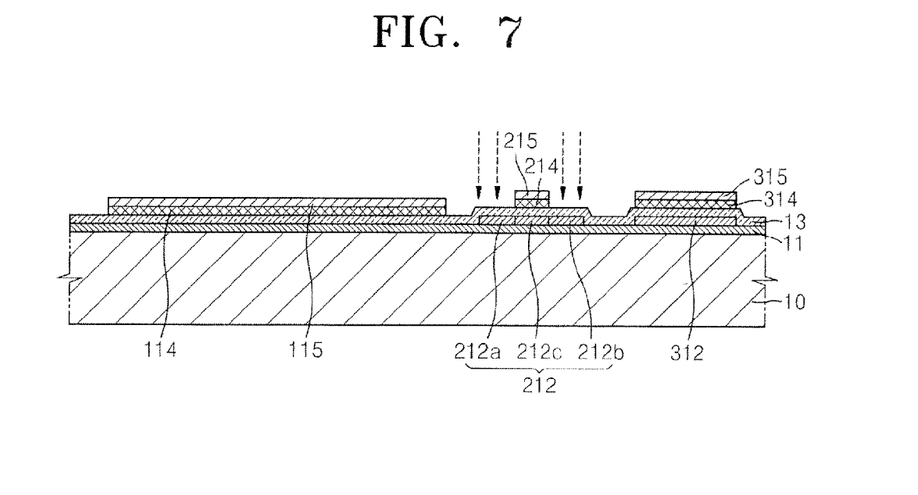

Referring now to FIG. 7, the active layer 212 is doped with ion impurities while using the gate electrodes 214 and 215 as an implantation mask. The ion implanting produces source and drain regions 212a and 212b doped with the ion impurities and a channel region 212c between the source and drain regions 212a and 212b and underneath the gate electrode absent of ion impurities. Because the gate electrodes 214 and 215 are used as the self-aligned mask, the source and drain regions 212a and 212b may be formed without using an additional photomask.

Figure 8:
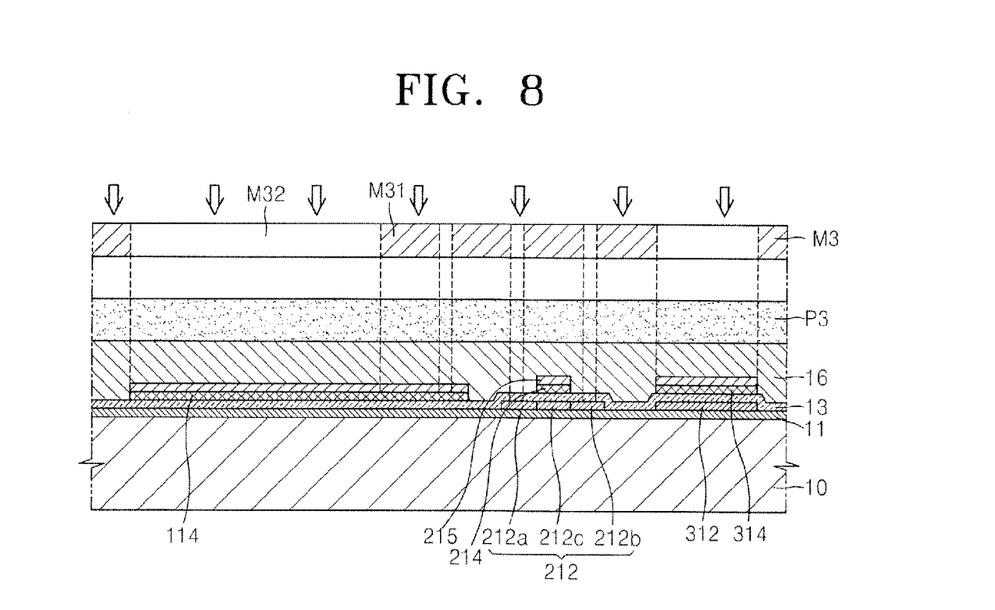

Referring now to FIG. 8, a second insulating layer 16 is formed on the resultant structure and a third photoresist layer P3 is applied on the resultant structure after the second mask process is performed. A third mask process is performed using a third photomask M3 that includes light-shielding portions P31 and light-transmitting portions M32.

Figure 9:
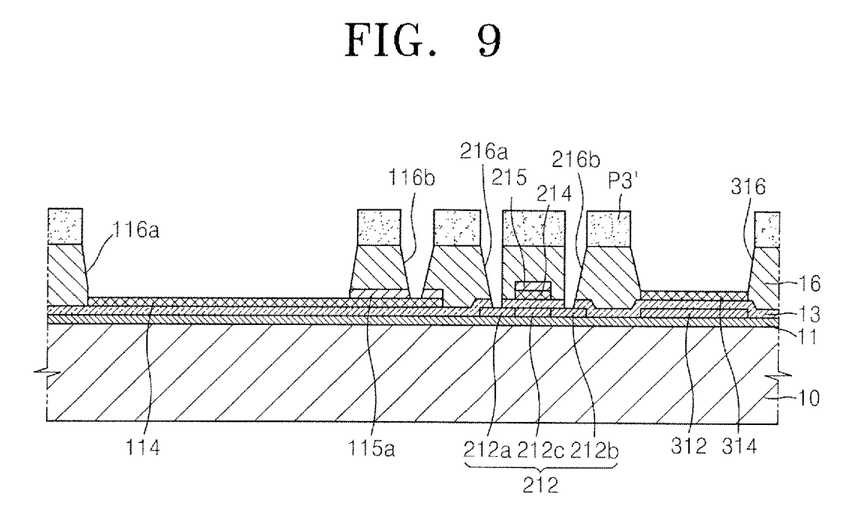

Referring now to FIG. 9, as a result of the third mask process, a first opening 116a that exposes the base layer 114 of the pixel electrode, contact holes 216a and 216b respectively exposing the source and drain regions 212a and 212b of the thin film transistor, and a second opening 316 exposing the second electrodes 314 of the capacitor are formed in the second insulating layer 16 by an etching process.

On the other hand, a portion 115a of first metal layer 115 remains on the first transparent conductive layer 114 of the pixel electrode at locations where the second insulating layer 16 has not been removed, that being between the first opening 116a and the contact holes 216a and 216b. A via-hole 116b in the first metal layer 115a and in the second insulating layer 16 may also be formed in the above third mask process.

FIG. 9 shows a state where the first metal layer 115 of the pixel electrode, which is exposed by the first opening 116a, and the first metal layer 315 of the capacitor, which is exposed by the second opening 316, are etched upon the performing of the etching process of the second insulating layer 16. In addition, in FIG. 9, the third photoresist P3' that is developed and patterned on the second insulating layer 16 and was used to etch the first opening 116a, the contact holes 216a and 216b, the via-hole 116b, and the second opening 316, remains on portions of the second insulating layer 16 where the first opening 116, the contact holes 216a and 216b, the via-hole 116b, and the second opening 316 are not formed.

Figure 10:
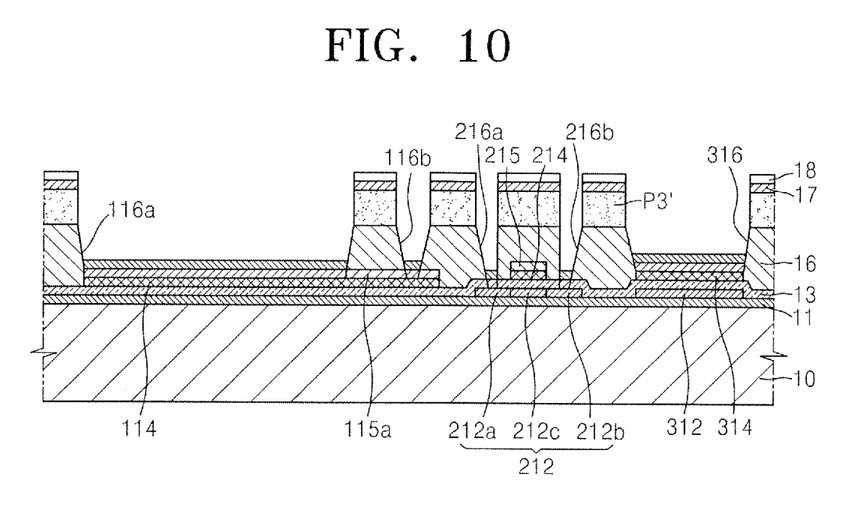

Referring now to FIG. 10, a reflective layer 17 and a second transparent conductive layer 18 are sequentially formed in the stated order on the structure of FIG. 9. The reflective layer 17 includes a reflective material. In the current embodiment, Ag is used as the reflective material, however the present invention is in no way so limited. That is, various other materials having a reflecting property may instead be used to form the reflective layer 17. The second transparent conductive layer 18 may be made out of at least one or more selected from a group consisting of ITO, IZO, ZnO, $In_2O_3$, IGO, and AZO, as in the case of the first transparent conductive layer 14.

Figure 11:
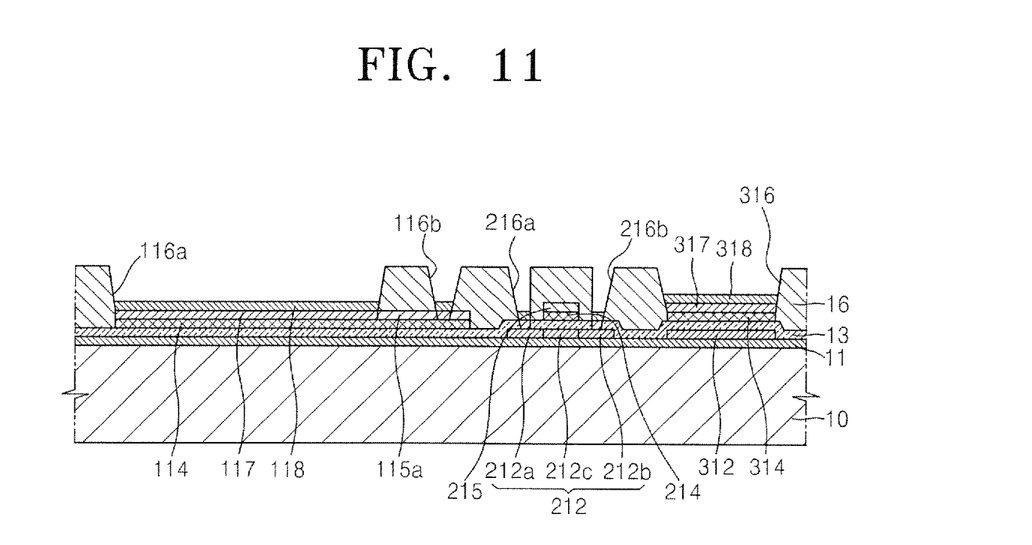

Referring now to FIG. 11, the patterned third photoresist layer P3' that remains on the second insulating layer 16 is removed. Here, the reflective layer 17 and the second transparent conductive layer 18 formed on the third photoresist P3' are lifted-off together. Thus, the reflective layer 17 and the second transparent conductive layer 18 only remain within the first opening 116a, the contact holes 216a and 216b, the via-hole 116b, and the second opening 316.

The reflective layer 17 and the second transparent conductive layer 18 formed in the first opening 116 form upper layers 117 and 118 of the pixel electrode, and the reflective layer 17 and the second transparent conductive layer 18 formed in the second opening 316 form the second electrodes 317 and 318 of the capacitor together with the first transparent conductive layer 314.

The upper layers 117 and 118 of the pixel electrode are made out of the reflective layer 17 including a reflective material and the second transparent conductive layer 18, and thus, the light may be partially transmitted or partially reflected by adjusting a thickness of the reflective layer 17 that includes the reflective material. That is, the upper layers 117 and 118 that may partially transmit or reflect light may be used as a transflective mirror for the organic light-emitting display device so that it adopts an optical resonant structure.

The upper layers 117 and 118 of the pixel electrode, which serve as the transflective mirror in the current embodiment, are formed after the second mask process that forms the gate electrodes 214 and 215 and the base layers 114 and 115 of the pixel electrode, and after the third mask process that etches some parts of the base layer 115 off the pixel electrode.

If the upper layers 117 and 118 of the pixel electrode including the reflective layer 17 and the second transparent conductive layer 18, which serve as the transflective mirror, are instead formed in the second mask process during the forming of the gate electrodes 214 and 215, that is, if the lower layer of the gate electrode 214 is formed to further include the reflective layer 17 and if gate electrode 215 is formed to further include the second transparent conductive layer 18, an entire thickness of the gate electrode increases, and thus, it is disadvantageous to form the gate electrode and wires (not shown) connected to the gate electrode.

In addition, if the transflective mirror were to be formed under the first metal layer 15 that forms the pixel electrode, the transflective mirror may be damaged by an etchant that removes the first metal layer 15 in the third mask process. In particular, if the transflective mirror includes Ag and the first metal layer 15 includes Al as in the current embodiment, the transflective mirror may be severely damaged by an aluminum etchant.

However, according to the embodiment of the present invention, the transflective mirror is formed after the formation of the gate electrodes 214 and 215, and thus damage to the transflective mirror by the etching of the first metal layer 15 forming the gate electrode and the pixel electrode may be prevented. Because reflective layer 17 is not exposed to the etchant used to remove portions of first metal layer 15, there is a greater degree of freedom the selection of possible materials for reflective layer 17 in the transflective mirror.

Figure 12:
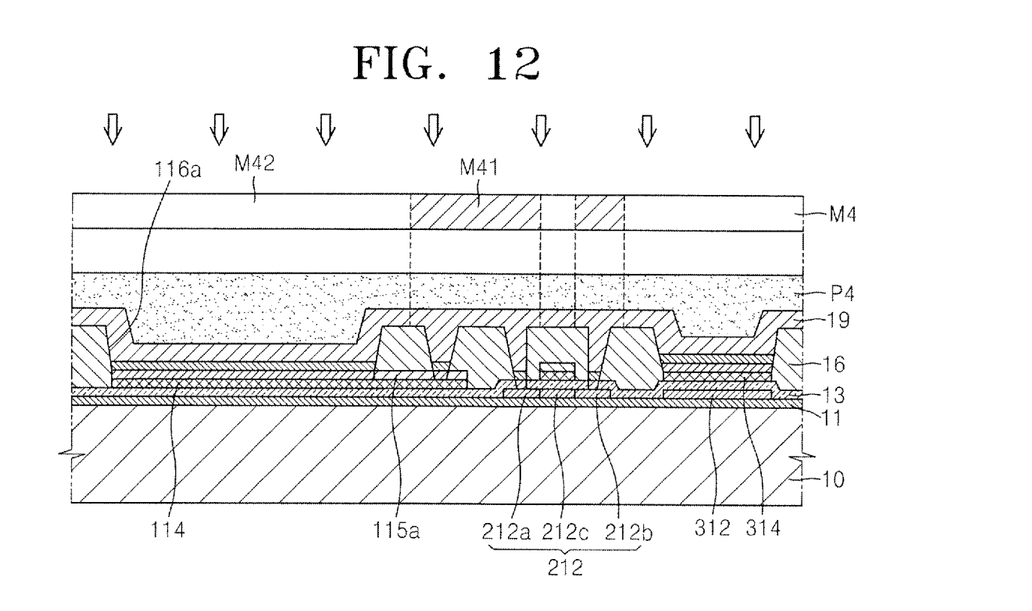

Referring now to FIG. 12, the second metal layer 19 and a fourth photoresist layer P4 are formed on the structure shown in FIG. 11, and a fourth mask process is performed using a fourth photomask M4 that includes light-shielding portions M41 and light-transmitting portions M42. The second metal layer 19 may include one or more metals selected from a group consisting Al, Pt, Pd, Ag, Mg, Au, Ni, Nd, Ir, Cr, Li, Ca, Mo, Ti, W, and Cu, a selection similar to that of the first metal layer 15. In the current embodiment, the second metal layer 19 includes Al, as in the first metal layer 15.

Figure 13:
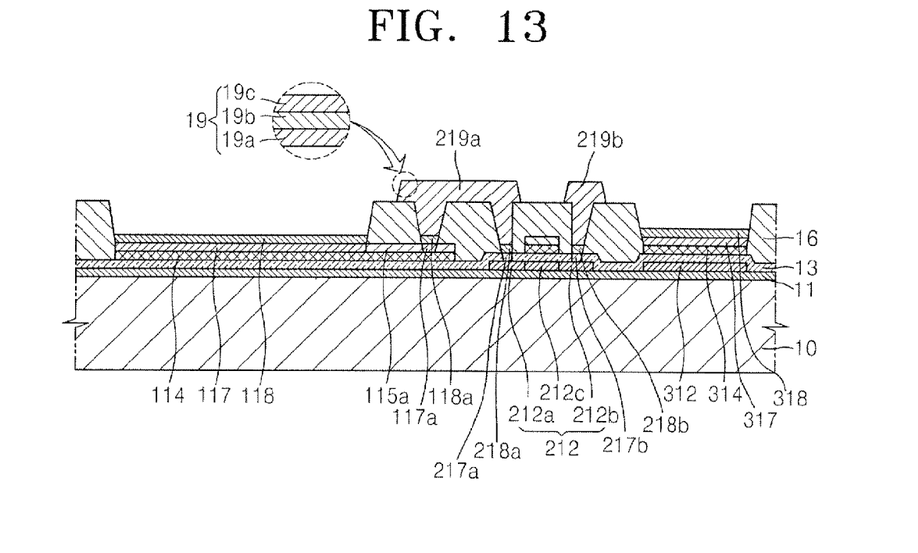

Referring now to FIG. 13, the second metal layer 19 in the first opening 116a of the pixel electrode and in the second opening 316 of the capacitor are removed, and the second metal layer 19 on portions of the second insulating layer 16 where the via-hole 116b and the contact holes 216a and 216b are formed remains to form a source electrode 219a and a drain electrode 219b.

The second metal layer 19 may include a plurality of metal layers 19a, 19b, and 19c, and in the current embodiment, the second metal layer 19 can include a three-layered structure (Mo/Al/Mo), that is, the metal layer 19b is made out of Al and upper and lower metal layers 19c and 19a respectively of the metal layer 19 are each made out of Mo, as in the first metal layer 15, however the present invention is in no way so limited as the second metal layer 19 may instead be made out of other various materials having other various layer arrangements.

The source and drain electrodes 219a and 219b respectively contact a second transparent conductive layer 118a formed in the via-hole 116b and second transparent conductive layers 218a and 218b formed in the contact holes 216a and 216b, which in turn contact the reflective layer 117a formed in the via-hole 116b and the reflective layers 217a and 217b formed in the contact holes 216a and 216b. In addition, the reflective layer 117a formed in the via-hole 116b and the reflective layers 217a and 217b formed in the contact holes 216a and 216b respectively contact the first transparent conductor film 114 on the pixel electrode and on the source and drain regions 212a and 212b.

Therefore, the reflective layers 217a and 217b and the second transparent conductive layers 218a and 218b are disposed between the source and drain electrodes 219a and 219b and the source and drain regions 212a and 212b, and thus, the source and drain electrodes 219a and 219b and wires (not shown) connected to the source and drain electrodes 219a and 219b may be formed to be thin, making it easier to produce the wire pattern. Moreover, when the reflective layers 217a and 217b are made out of a material having low resistance, such as Ag, wire resistance may be reduced.

Figure 14:
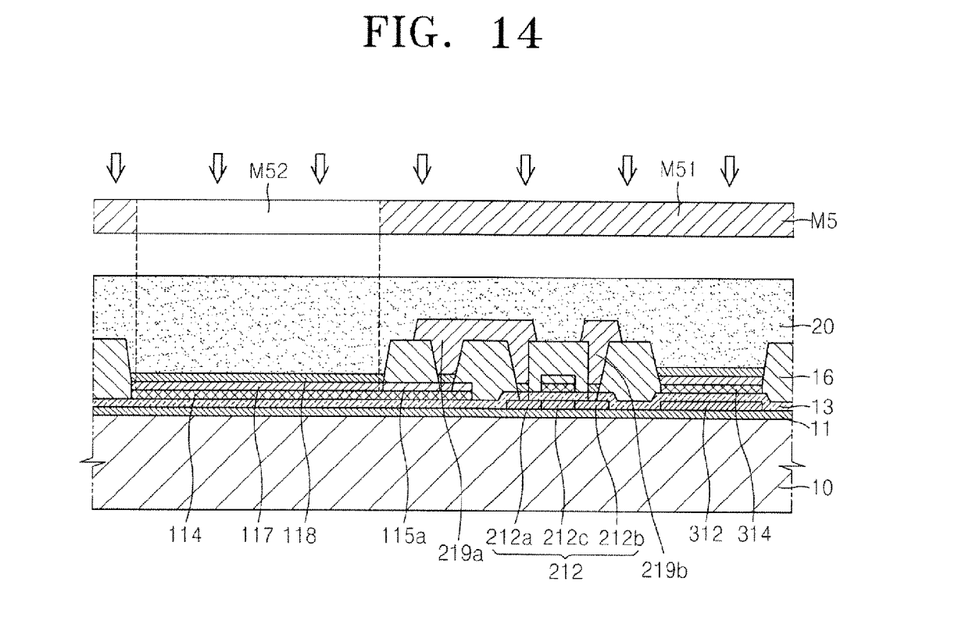

Referring now to FIG. 14, a third insulating layer 20 is formed on the structure of FIG. 13, the third insulating layer 20 may be an organic insulating layer or an inorganic insulating layer. The third insulating layer 20 may include photosensitive material, however the present invention is no way limited. That is, a fifth photoresist layer (not shown) may be formed on the third insulating layer 20. A fifth mask process is then performed using a fifth photomask M5 including light-shielding portions M51 and light-transmitting portions M52. Referring now to FIG. 15, as a result of the fifth photomask process, an opening 120 is formed in the third insulating layer 20 to produce a pixel defining layer (PDL) formed over edges of the upper layers 117 and 118 of the pixel electrode and covering the source and drain electrodes 219a and 219b.

The PDL increases a distance between edges of the upper layers 117 and 118 of the pixel electrode and an opposite electrode 22 that will be described later in order to prevent an electric field from concentrating on the edges of the upper layers 117 and 118, in addition to a function of defining light-emitting regions, and thus, prevents short circuits from occurring between the pixel electrodes 114, 117, and 118 and the opposite electrode 22.

Referring now to FIG. 16, an intermediate layer 21, including an organic emission layer 21a, and the opposite electrode 22 are formed on the upper layers 117 and 118 of the pixel electrode. The organic emission layer 21a may be made out of a low-molecular weight organic material or high-molecular weight organic material.

When the organic emission layer 21a includes a low-molecular weight organic layer, the intermediate layer 21 may also include a hole injection layer (HIL), a hole transport layer (HTL) in a direction toward the pixel electrodes 114, 117, and 118, and an electron transport layer (ETL), and an electron injection layer (EIL) in a direction of the opposite electrode 22 with respect to the organic emission layer 21a. Examples of organic materials may be copper phthalocyanine (CuPc), N,N'-di(naphthalene-1-yl)-N,N'-diphenyl-benzidine (NPB), tris-8-hydroxyquinoline aluminum (Alq3), and the like.

When the organic emission layer 21a includes a high-molecular weight organic layer, the intermediate layer 21 may mostly have a structure including a HTL in the direction toward the pixel electrodes 114, 117, and 118 from the organic emission layer 21a. In this case, the HTL may be made out of poly (ethylenedioxythiophene) (PEDOT) or polyaniline (PANI) and be produced by an inkjet printing or a spin coating technique on the pixel electrodes 114, 117, and 118. The organic material may be polyphenylenevinylenes (PPVs) or polyfluorenes, and may be formed by screen printing, inkjet printing, thermal transferring using a laser, or the like.

The optical resonant structure may be realized with the intermediate layer 21, including the organic emission layer 21a, by adjusting a thickness of the organic emission layer 21a in each of the pixels, or adjusting a thickness of another organic layer (not shown) included in the intermediate layer 21.

The opposite electrode 22 is deposited on the intermediate layer 21 as a common electrode. In the organic light-emitting display device of the current embodiment, the pixel electrodes 114, 117, and 118 are used as anode electrodes, and the opposite electrode 22 is used as a cathode electrode, however the polarities of the electrodes can instead be reversed. In addition, the opposite electrode 22 may be a reflective electrode that includes a reflective material to realize the optical resonant structure. At this time, the opposite electrode 22 may include one or more materials selected from a group consisting of Al, Mg, Li, Ca, LiF/Ca, and LiF/Al. Furthermore, although it is not shown in the drawings, a sealing member (not shown) or a moisture absorbent material (not shown) for protecting the organic emission layer 21a from external moisture or oxygen may be further formed on the opposite electrode 22.

An organic light-emitting display device and a method of manufacturing the organic light-emitting display device according to the present invention has the following advantages. A reflective layer and a second transparent conductive layer forming the transflective mirror are formed after the process of forming a gate electrode, and thus damage to the transflective mirror by the etchant used to produce the gate electrode may be prevented. In addition, since the reflective layer and the second transparent conductive layer forming the transflective mirror are formed after forming the gate electrode, the degree of freedom in selecting the materials that can be used for the transflective mirror is increased. Also, since the reflective layer and the first transparent conductive layer are formed between the source and drain electrodes and the source and drain regions, the resistance may be lowered. In addition, the organic light-emitting display device including the transflective mirror may be fabricated by using only five sets of mask processes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device, comprising:
an active layer of a thin film transistor arranged on a substrate;
a first insulating layer and a gate electrode arranged on the active layer, the gate electrode including a first transparent conductive layer and a first metal layer;
a second insulating layer arranged on the gate electrode and including a plurality of contact holes that expose a source region and a drain region of the active layer;
a reflective layer and a second transparent conductive layer arranged within the contact holes;
a source electrode and a drain electrode arranged on the second transparent conductive layer and on the second insulating layer, the source electrode and the drain electrode each including a second metal layer;

a pixel electrode arranged on the first insulating layer, the pixel electrode including the first transparent conductive layer, the reflective layer, and the second transparent conductive layer;

an intermediate layer arranged on the pixel electrode and including an organic emission layer; and an opposite electrode facing the pixel electrode, wherein the intermediate layer is arranged between the pixel electrode and the opposite electrode.

2. The organic light-emitting display device of claim 1, wherein the reflective layer comprises silver (Ag).

3. The organic light-emitting display device of claim 1, wherein the first transparent conductive layer and the second transparent conductive layer each comprise at least one material selected from a group consisting of indium tin oxide (ITO), indium zinc oxide (IZO), zinc oxide (ZnO), indium oxide (In2O3), indium gallium oxide (IGO), and aluminum zinc oxide (AZO).

4. The organic light-emitting display device of claim 1, wherein the first metal layer and the second metal layer each comprise a plurality of metal layers.

5. The organic light-emitting display device of claim 1, wherein the first metal layer and the second metal layer are comprised of a same material.

6. The organic light-emitting display device of claim 1, wherein the first metal layer and the second metal layer each comprise aluminum (Al).

7. The organic light-emitting display device of claim 1, wherein an end portion of the first transparent conductive layer of the pixel electrode, and end portions of the reflective layer and the second transparent conductive layer have different etching surfaces from each other.

8. The organic light-emitting display device of claim 1, wherein the first metal layer is arranged on an upper portion of the first transparent conductive layer of the pixel electrode, on a side surface of the reflective layer, and on a lower portion of the second insulating layer.

9. The organic light-emitting display device of claim 8, wherein the first metal layer is connected to one of the source electrode and the drain electrode via a via-hole that is arranged in the second insulating layer.

10. The organic light-emitting display device of claim 9, wherein the reflective layer and the second transparent conductive layer are arranged within the via-hole.

11. The organic light-emitting display device of claim 1, further comprising a capacitor including:
a first electrode that includes a same material as that of the active layer and is arranged on a same layer as the active layer; and
a second electrode including the first transparent conductive layer, the first insulating layer being arranged between the first electrode and the second electrode.

12. The organic light-emitting display device of claim 11, wherein the second electrode of the capacitor further comprises the reflective layer and the second transparent conductive layer on the first transparent conductive layer.

13. The organic light-emitting display device of claim 1, wherein the pixel electrode is a transflective mirror that partially transmits and partially reflects light emitted from the organic emission layer.

14. The organic light-emitting display device of claim 1, wherein the opposite electrode is a reflecting mirror that reflects light emitted from the organic emission layer.

15. The organic light-emitting display device of claim 1, further comprising a pixel defining layer surrounding edges of the pixel electrode and covering the source and drain electrodes.

16. A method of manufacturing an organic light-emitting display device, comprising:
forming a semiconductor layer on a substrate;
forming an active layer of a thin film transistor by patterning the semiconductor layer;
forming a first insulating layer, a first transparent conductive layer, and a first metal layer on the active layer;
forming a base layer of a pixel electrode and a gate electrode of the thin film transistor by patterning the first transparent conductive layer and the first metal layer;
forming a second insulating layer and a photoresist layer on the base layer of the pixel electrode and on the gate electrode;
forming a first opening exposing the first transparent conductive layer of the pixel electrode while forming contact holes exposing source and drain regions of the active layer of the thin film transistor by patterning the second insulating layer and the photoresist layer;
forming a reflective layer and a second transparent conductive layer in the first opening, in the contact holes, and on the photoresist layer that remains on the second insulating layer after the first opening and the contact holes are formed;
removing the photoresist layer;
forming a second metal layer in the first opening and in the contact holes; and
forming a source electrode and a drain electrode by patterning the second metal layer.

17. The method of claim 16, further comprising forming the source and drain regions in the active layer after the forming of the gate electrode by doping the active layer with ion impurities while using the gate electrode as a mask.

18. The method of claim 16, wherein the forming of the first opening and the contact holes comprises:
forming the first opening and the contact holes in the second insulating layer by a first etching process; and
removing the first metal layer on the base layer of the pixel electrode exposed by the first opening by a second etching process.

19. The method of claim 16, further comprising forming a via-hole in the first metal layer and in the second insulating layer on the base layer when the first opening and the contact holes are formed.

20. The method of claim 19, wherein the reflective layer and the second transparent conductive layer are arranged within the via-hole.

21. The method of claim 19, wherein the source and drain electrodes are simultaneously formed and are arranged within the contact holes and within the via-hole.

22. The method of claim 16, further comprising:
exposing upper layers of the pixel electrode; and
forming a third insulating layer covering the source and drain electrodes after forming the source and drain electrodes.

23. The method of claim 22, wherein the third insulating layer is produced by a mask process.

24. The method of claim 16, wherein a first electrode of a capacitor is comprised of a same material as the active layer and is arranged on a same layer as the active layer and is formed when the active layer is formed, and a second electrode of the capacitor is comprised of the first transparent conductive layer and is formed when the gate electrode is formed.

25. The method of claim 24, wherein the reflective layer, the second transparent conductive layer, and the second metal layer are further arranged on the first transparent conductive layer of the capacitor.

* * * * *